US009173321B2

(12) United States Patent
Yu et al.

(10) Patent No.: US 9,173,321 B2
(45) Date of Patent: Oct. 27, 2015

(54) ELECTRONIC DEVICE WITH AIRFLOW CONTROL STRUCTURE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Lin Yu, Wuhan (CN); Zhi-Ping Wu, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 249 days.

(21) Appl. No.: 14/015,104

(22) Filed: Aug. 30, 2013

(65) Prior Publication Data
US 2014/0185239 A1    Jul. 3, 2014

(30) Foreign Application Priority Data
Dec. 27, 2012  (CN) .......................... 2012 1 0577477

(51) Int. Cl.
H05K 7/20    (2006.01)
(52) U.S. Cl.
CPC ................. *H05K 7/20145* (2013.01)
(58) Field of Classification Search
CPC ................. H05K 7/20145; H05K 7/20181
USPC ......... 361/679.46–679.54, 688–723; 454/184
See application file for complete search history.

(56) References Cited

U.S. PATENT DOCUMENTS

| 6,400,567 | B1 * | 6/2002 | McKeen et al. | 361/695 |
| 6,736,196 | B2 * | 5/2004 | Lai et al. | 165/122 |
| 7,259,962 | B2 * | 8/2007 | Chen | 361/695 |
| 8,068,340 | B1 * | 11/2011 | Nguyen et al. | 361/695 |
| 8,248,793 | B2 * | 8/2012 | Bash et al. | 361/695 |
| 8,659,894 | B2 * | 2/2014 | Chao et al. | 361/690 |
| 8,830,673 | B2 * | 9/2014 | Kuo | 361/679.48 |
| 8,861,195 | B2 * | 10/2014 | Fu | 361/679.47 |
| 2003/0128514 | A1 * | 7/2003 | Inoue | 361/695 |
| 2004/0136159 | A1 * | 7/2004 | Hein | 361/688 |
| 2009/0215380 | A1 * | 8/2009 | Lin | 454/184 |
| 2009/0310296 | A1 * | 12/2009 | Peng et al. | 361/679.49 |
| 2010/0186932 | A1 * | 7/2010 | Chou | 165/104.34 |
| 2010/0290187 | A1 * | 11/2010 | Guan | 361/695 |
| 2011/0184568 | A1 * | 7/2011 | Tai et al. | 700/282 |
| 2011/0189935 | A1 * | 8/2011 | Chou et al. | 454/184 |
| 2011/0297349 | A1 * | 12/2011 | Zhou | 165/67 |
| 2012/0289142 | A1 * | 11/2012 | Liu | 454/284 |
| 2013/0148290 | A1 * | 6/2013 | Chen | 361/679.46 |
| 2014/0179215 | A1 * | 6/2014 | Yu et al. | 454/184 |

* cited by examiner

*Primary Examiner* — David M Sinclair
*Assistant Examiner* — Robert Brown
(74) *Attorney, Agent, or Firm* — Novak Druce Connolly Bove + Quigg LLP

(57) ABSTRACT

An electronic device includes a chassis, an air-guiding housing mounted in the chassis, and an airflow control member. The chassis includes a base panel with a plurality of ventilation holes. The air-guiding housing comprises an airflow passage aligned with the plurality of ventilation holes. The airflow control member includes a shielding plate attached on the base panel. The airflow control member is movable between a first position and a second position. In the first position, the shielding plate is located beside the air-guiding housing, and the airflow passage is communicated with the plurality of ventilation holes for allowing air flowing to an outside of the chassis via the plurality of ventilation holes. In the second position, the shielding plate is located between the air-guiding housing and the base panel for closing the plurality of ventilation holes and preventing air flowing to the outside of the chassis.

20 Claims, 5 Drawing Sheets

ELECTRONIC DEVICE WITH AIRFLOW CONTROL STRUCTURE

BACKGROUND

1. Technical Field

The present disclosure relates to a electronic device with an airflow control structure.

2. Description of Related Art

A electronic device includes a plurality of heat generating components which generate lots of heat during working. The heat is discharged to an outside of the electronic device for preventing overheat of the electronic device. However, if the electronic device works under a low ambient temperature, some of the heat should be kept in the electronic device for increasing a temperature in the electronic device.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean "at least one."

Figure 1:
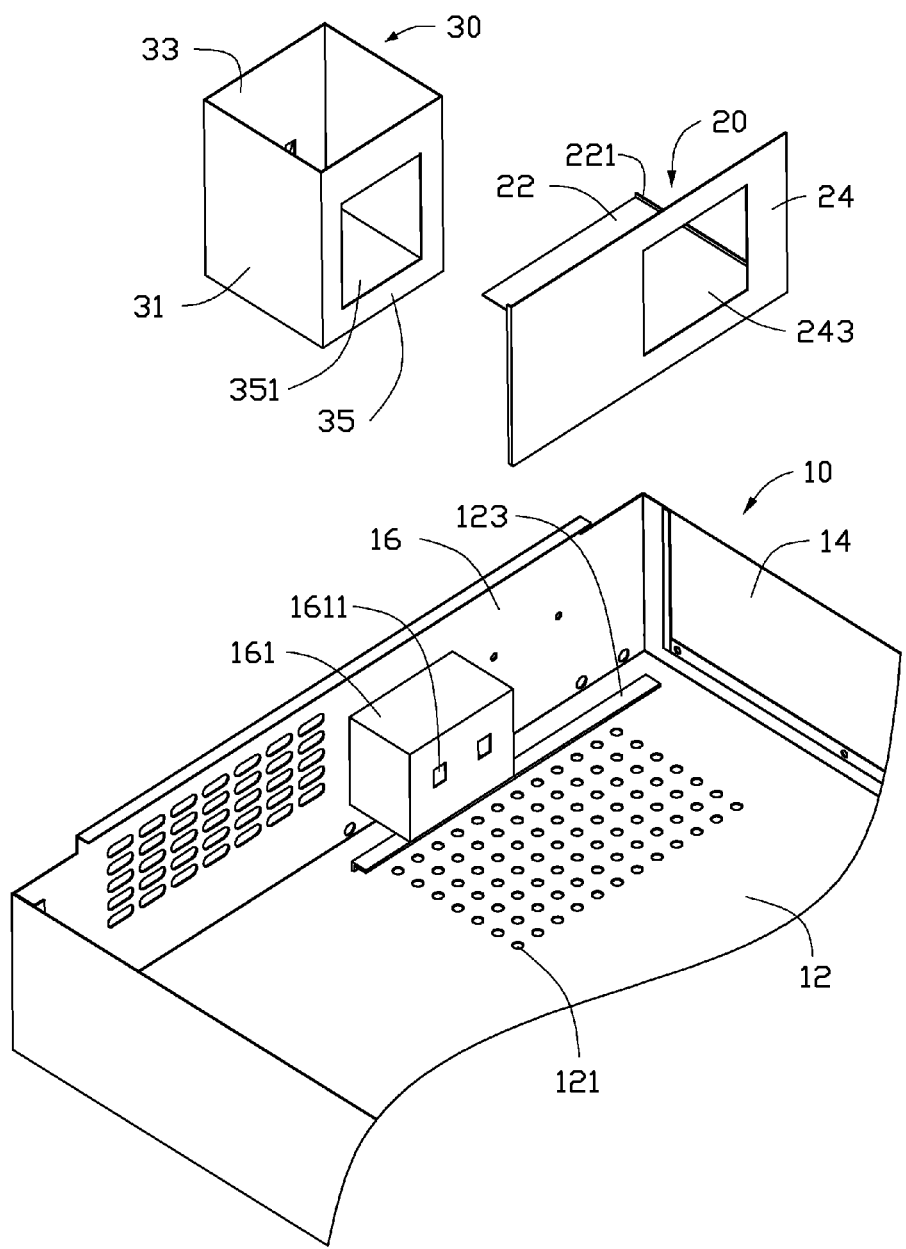
FIG. 1 is an exploded view of an embodiment of an electronic device with an airflow control structure.
Figure 2:
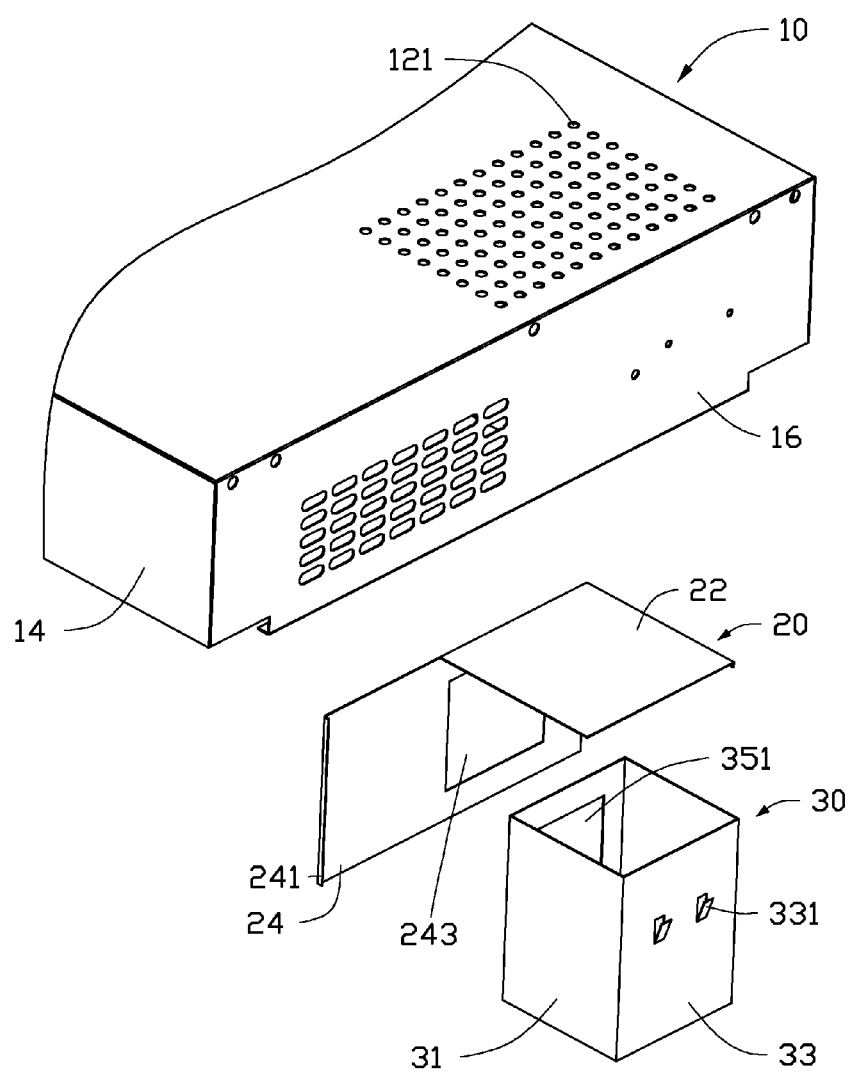
FIG. 2 is similar to FIG. 1, but viewed from another aspect.

FIGS. 1 and 2 show an embodiment of a electronic device includes a chassis 10, an airflow control member 20, and an air-guiding housing 30.

The chassis 10 includes a base panel 12, a pair of first side panels 14 extending substantially perpendicularly from opposite sides of the base panel 12, and a second side panel 16 connected to and located between the pair of first side panels 14. A mounting block 161 is attached to an inner side of the second side panel 16. A pair of mounting holes 1611 is defined in the mounting block 161 for mounting the air-guiding housing 30. A plurality of ventilation holes 121 is defined in the base panel 12. A limiting piece 123 is attached on the base panel 12 and located below the mounting block 161. The limiting piece 123 has an L-shape and is located between the second side panel 16 and the plurality of ventilation holes 121. The plurality of ventilation holes 121 is arrayed in a matrix pattern and occupies a rectangular area in the base panel 12. A length of the limiting piece 123 is greater than that of the rectangular area.

The airflow control member 20 includes a first shielding plate 22 and a second shielding plate 24 connected substantially perpendicularly to the first shielding plate 22. The first shielding plate 22 has a square shape. The second shielding plate 24 has a rectangular shape. A length of each side edge of the first shielding plate 22 is a half of the length of the second shielding plate 24. The second shielding plate 24 includes a first half and a second half. The first shielding plate 22 extends substantially perpendicularly from the first half of the second shielding plate 24. A first opening 243 is defined in the first half of the second shielding plate 24. The first opening 243 has a square or rectangular shape. A length of the first opening 243 is less than the length of the first shielding plate 22. A first short edge of the second shielding plate 24 is perpendicularly connected to one side edge of the first shielding plate 22. A first blocking flange 221 extends substantially perpendicularly from the one side edge of the first shielding plate 22 and is connected to the first short edge of the second shielding plate 24. A second blocking flange 241 extends substantially perpendicularly from a second short edge of the second shielding plate 24. The first blocking flange 221 is substantially perpendicular to the second blocking flange 241.

The air-guiding housing 30 includes a pair of first side plates 31 which are parallel to each other, a second side plate 33 connected to and located between the pair of first side plates 31, and a third side plate 35 connected to and located between the pair of first side plates 31. The second side plate 33 and the third side plate 35 are parallel to each other and perpendicular to the pair of first side plates 31. The air-guiding housing 30 includes an upper opening surrounded by upper edges of the pair of first side plates 31, the second side plate 33, and the third side plate 35, and a lower opening surrounded by lower edges of the pair of first side plates 31, the second side plate 33, and the third side plate 35. The upper and lower openings of the air-guiding housing 30 allows air flowing through the air-guiding housing 30 along a first direction that is parallel to the pair of first side plates 31, the second side plate 33, and the third side plate 35. A pair of mounting pieces 331 extends obliquely from the second side plate 33 corresponding to the pair of mounting holes 1611. A second opening 351 is defined in the third side plate 35. The second opening 351 allows air flowing out from the air-guiding housing 30 along a second direction that is perpendicular to the second side plate 33 and the third side plate 35.

Figure 3:
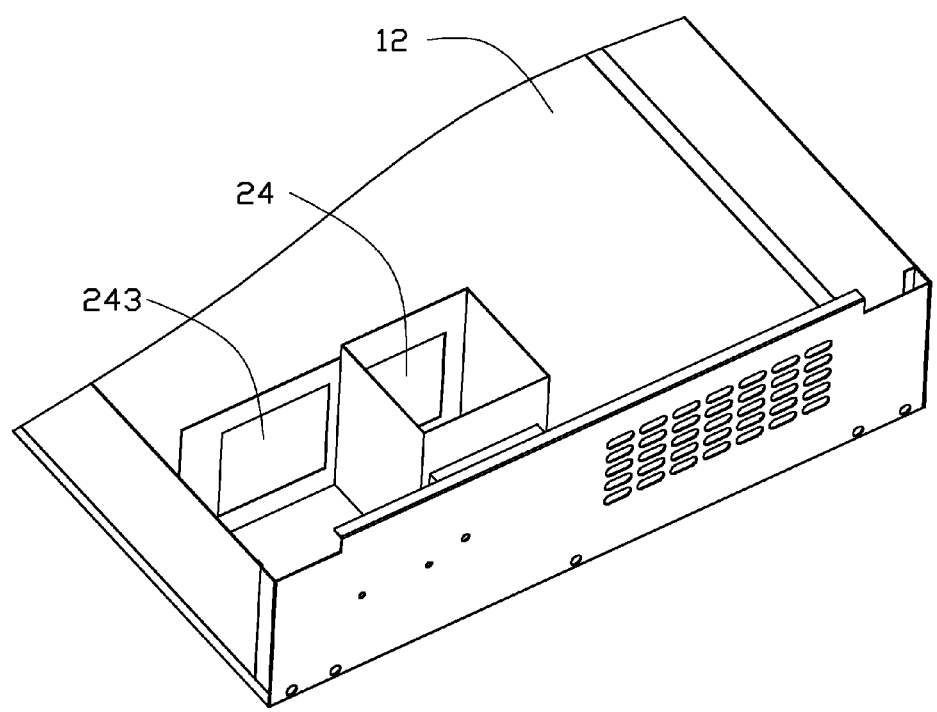
FIG. 3 is an assembled view of the electronic device of FIG. 1, showing a control member in a first position.
Figure 4:
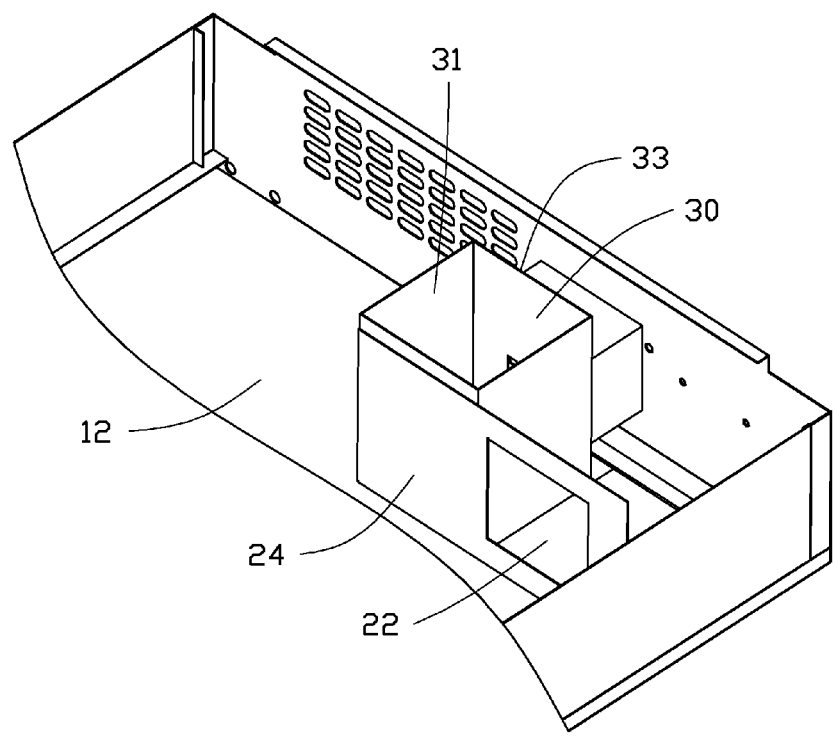
FIG. 4 is similar to FIG. 3, but viewed from another aspect.
Figure 5:
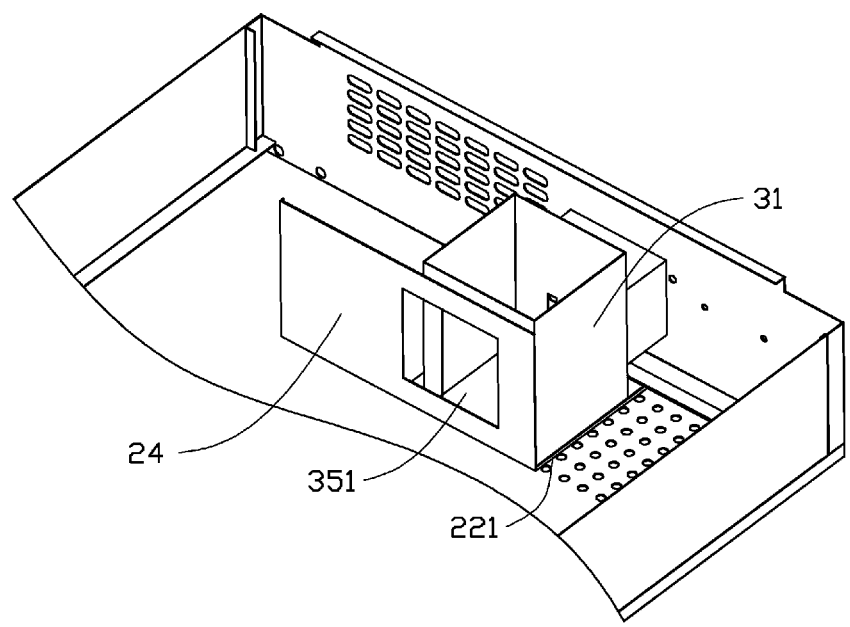
FIG. 5 is an assembled view of the electronic device of FIG. 1, showing the control member at a second position.

FIGS. 3 to 5 show in assembly, the pair of mounting pieces 331 is mounted in the pair of mounting holes 1611. The air-guiding housing 30 is attached to the mounting block 161. An interspace exists between a bottom of the air-guiding housing 30 and the base panel 12 for accommodating the first shielding plate 22. The first shielding plate 22 is movably attached on the base panel 12. The first shielding plate 22 includes a side edge that is parallel to the second shielding plate 24 and located below the limiting piece 123. The limiting piece 123 limits upward movement of the airflow control member 20. The airflow control member 20 is movable along a third direction that is perpendicular to the pair of first side panels 14 or along a fourth direction that is opposite to the third direction.

When a temperature in the electronic device exceeds a predetermined temperature, the airflow control member 20 is located at a first position (See FIGS. 3 and 4). The second opening 351 is shielded by the second half of the second shielding plate 24. The lower opening of the air-guiding housing 30 is aligned with some of the plurality of ventilation holes 121. Heat air can flow through the air-guiding housing 30 and flow out from some of the plurality of ventilation holes 121 below the air-guiding housing 30. Thus, heat air can be discharged to outside of the chassis 10 for decreasing the temperature in the electronic device. In the first position, the air-guiding housing 30 abuts the second blocking flange 241 for preventing the airflow control member 20 moving along the third direction.

When the temperature in the electronic device does not exceed the predetermined temperature, the airflow control member 20 is moved from the first position to a second position (see FIG. 5) along the fourth direction. The first shielding plate 22 is located between the bottom of the air-guiding housing 30 and the base panel 12. The first opening 243 is aligned with the second opening 351. The first shielding plate 22 shields the lower opening of the air-guiding housing 30. Some of the plurality of ventilation holes 121 below the air-guiding housing 30 is closed by the first shielding plate 22. Heat air in the air-guiding housing 30 can not flow out of the chassis 10, but flows to inner side of the chassis 10 via the second opening 351. It helps to increases the temperature in the chassis 10. In the second position, the air-guiding housing 30 abuts the first blocking flange 221 for preventing the airflow control member moving along the fourth direction.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. An electronic device comprising:
   a chassis comprising a base panel with a plurality of ventilation holes defined therein;
   an air-guiding housing, mounted in the chassis, and comprising an airflow passage aligned with the plurality of ventilation holes; and
   an airflow control member comprising a first shielding plate attached to the base panel;
   wherein the airflow control member is movable between a first position, where the first shielding plate is located beside the air-guiding housing, and the airflow passage is communicated with the plurality of ventilation holes for allowing air flowing to an outside of the chassis via the plurality of ventilation holes; and a second position, where the first shielding plate is located between the air-guiding housing and the base panel for closing the plurality of ventilation holes and preventing air flowing to the outside of the chassis.

2. The electronic device of claim 1, wherein the air-guiding housing comprises a pair of first side plates which are parallel to each other, a second side plate connected to and located between the pair of first side plates, and a third side plate connected to and located between the pair of first side plates; the second side plate and the third side plate are parallel to each other and perpendicular to the pair of first side plates; and the airflow passage is surrounded by the pair of first side plates, the second side plate, and the third side plate.

3. The electronic device of claim 2, wherein the airflow control member further comprises a second shielding plate connected to and substantially perpendicular to the first shielding plate, a first opening is defined in the second shielding plate, and a second opening is defined in the second side plate corresponding to the first opening.

4. The electronic device of claim 3, wherein in the second position, the first opening is aligned with the second opening for allowing air flowing to an inner side of the chassis via the second opening and the first opening; and in the first position, the first opening is spaced from the second opening, and the second opening is shielded by the second shielding plate.

5. The electronic device of claim 4, wherein the first shielding plate has a square shape, the second shielding plate has a rectangular shape, and a length of each side edge of the first shielding plate is a half of the length of the second shielding plate.

6. The electronic device of claim 5, wherein the second shielding plate comprises a first half and a second half, the first shielding plate extends substantially perpendicularly from the first half, and the first opening is defined in the first half.

7. The electronic device of claim 6, wherein the second opening is shielded by the second half in the first position.

8. The electronic device of claim 3, wherein the first shielding plate comprises a first side edge connected to and substantially perpendicular to a first short edge of the second shielding plate, a first blocking flange extends substantially perpendicularly from the first side edge, and a second blocking flange extends substantially perpendicularly from a second short edge of the second shielding plate.

9. The electronic device of claim 8, wherein the air-guiding housing abuts the second blocking flange in the first position for preventing the airflow control member from moving along a first direction that is substantially perpendicular to the pair of first side plates, and the air-guiding housing abuts the first blocking flange in the second position along a second direction that is opposite to the first direction.

10. The electronic device of claim 2, wherein the chassis further comprises a side panel extending substantially perpendicularly from the base panel, and the air-guiding housing is attached to the side panel; and the third side plate is substantially parallel to the side panel.

11. An electronic device comprising:
    a chassis comprising a base panel with a plurality of ventilation holes defined therein;
    an air-guiding housing, mounted in the chassis, and comprising an airflow passage and a ventilation opening defined in a side plate of the air-guiding housing;
    an airflow control member comprising a first shielding plate attached to the base panel and a second shielding plate connected to the first shielding plate;
    wherein the airflow control member is movable between a first position and a second position; in the first position, the first shielding plate is located beside the air-guiding housing, the ventilation opening is shielded by the second shielding plate, and the airflow passage is communicated with the plurality of ventilation holes for allowing air flowing to an outside of the chassis via the plurality of ventilation holes; and in the second position, the first shielding plate is located between the air-guiding housing and the base panel for closing the plurality of ventilation holes and preventing air flowing to the outside of the chassis, and the ventilation opening is open to allow air flowing to an inner side of the chassis.

12. The electronic device of claim 11, wherein the second shielding plate is substantially perpendicular to the first shielding plate, an opening is defined in the second shielding plate corresponding to the ventilation opening.

13. The electronic device of claim 12, wherein in the second position, the opening is aligned with the ventilation opening for allowing air flowing to an inner side of the chassis via the ventilation opening; and in the first position, the opening is spaced from the ventilation opening.

14. The electronic device of claim 13, wherein the first shielding plate has a square shape, the second shielding plate has a rectangular shape, and a length of each side edge of the first shielding plate is a half of the length of the second shielding plate.

15. The electronic device of claim 14, wherein the second shielding plate comprises a first half and a second half, the first shielding plate extends substantially perpendicularly from the first half, and the opening is defined in the first half.

16. The electronic device of claim 15, wherein the ventilation opening is shielded by the second half in the first position.

17. The electronic device of claim 11, wherein the first shielding plate comprises a first side edge connected to and substantially perpendicular to a first short edge of the second shielding plate, a first blocking flange extends substantially perpendicularly from the first side edge, and a second blocking flange extends substantially perpendicularly from a second short edge of the second shielding plate.

18. The electronic device of claim 17, wherein the air-guiding housing abuts the second blocking flange in the first position for preventing the airflow control member from moving along a first direction, and the air-guiding housing abuts the first blocking flange in the second position for preventing the airflow control member from moving along a second direction that is opposite to the first direction.

19. The electronic device of claim 11, wherein the chassis further comprises a side panel extending substantially perpendicularly from the base panel, and the air-guiding housing is attached to the side panel; and the side plate is substantially parallel to the side panel.

20. The electronic device of claim 19, wherein an L-shaped limiting piece is attached on the base panel and located between the side panel and the plurality of ventilation holes, and the first shielding plate comprises a side edge that is parallel to the second shielding plate and located below the L-shaped limiting piece.

* * * * *